United States Patent
Kabadi

[11] Patent Number: 6,097,609
[45] Date of Patent: Aug. 1, 2000

[54] DIRECT BGA SOCKET

[75] Inventor: Ashok N. Kabadi, Portland, Oreg.

[73] Assignee: Intel Corporation, Santa Clara, Calif.

[21] Appl. No.: 09/223,647

[22] Filed: Dec. 30, 1998

[51] Int. Cl.[7] ................................................ H05K 7/02
[52] U.S. Cl. ...................... 361/760; 361/764; 361/765;
361/783; 361/790; 361/807; 257/724; 257/686;
257/704; 257/738; 174/253; 174/255; 174/260;
439/66; 439/68; 228/180.21; 228/180.22
[58] Field of Search ...................................... 361/760, 764,
361/765, 783, 790, 807; 257/724, 676,
704, 738, 778, 686, 726, 727; 174/52.1,
52.4, 250, 253, 255, 260; 439/66, 70, 68;
228/180.21, 180.22

[56] References Cited

U.S. PATENT DOCUMENTS

| | | | |
|---|---|---|---|
| 5,239,198 | 8/1993 | Lin et al. ................................. | 257/693 |
| 5,285,352 | 2/1994 | Pastore et al. .......................... | 361/707 |
| 5,530,289 | 6/1996 | Hirano et al. ........................... | 257/723 |
| 5,579,208 | 11/1996 | Honda et al. ........................... | 361/813 |
| 5,613,033 | 3/1997 | Swamy et al. .......................... | 361/790 |
| 5,712,768 | 1/1998 | Werther .................................. | 361/767 |
| 5,772,451 | 6/1998 | Dozier, II et al. ....................... | 439/70 |
| 5,800,184 | 9/1998 | Lopergolo et al. ...................... | 439/66 |
| 5,810,607 | 9/1998 | Shih et al. ............................... | 439/66 |
| 5,815,372 | 9/1998 | Gallas .................................... | 361/760 |
| 5,838,061 | 11/1998 | Kim ...................................... | 257/686 |
| 5,870,289 | 2/1999 | Takuda et al. .......................... | 361/779 |
| 5,994,774 | 11/1999 | Siegel et al. ........................... | 257/727 |

FOREIGN PATENT DOCUMENTS 363211663A   9/1988   Japan ..................................... 257/724

*Primary Examiner*—Leo P. Picard
*Assistant Examiner*—David Foster
*Attorney, Agent, or Firm*—John N. Greaves

[57] ABSTRACT

An electronic packaging assembly is disclosed. An electronic component is disposed on a socketing substrate utilizing a ball grid array or land grid array. The socketing substrate contains a series of pins that are embedded within the thickness of the socketing substrate. The pins correspond with the ball grid array or land grid array contacts of the electronic component. The socketing substrate is mounted onto a motherboard using an array of solder balls that correspond to and are disposed on, the end of the pins facing the motherboard. If desired, the electronic component may be protected by a metal lid. If desired, socketing substrates can be disposed on both sides of a motherboard.

20 Claims, 2 Drawing Sheets

DIRECT BGA SOCKET

FIELD OF INVENTION

The present invention pertains to the field of electronics packaging. More specifically, the present invention discloses a package for semiconductor devices utilizing ball-grid-array technology.

BACKGROUND

Ball grid array ("BGA") and land grid array ("LGA") are technologies presently used for mounting packaged semiconductor components onto boards. A semiconductor component is packaged by mounting it on a plastic substrate. The component is coupled to leads on the substrate, either by wirebonding or using solderbumps to electrically connect bond pads of the component onto the substrate. The component is protected from the ambient by an encapsulant that covers the entire top surface of the component and a portion of the substrate on which the component is mounted. The underside of the plastic substrate contains a two-dimensional array of contacts. If the package is BGA, then the contacts contain solder balls. If the package is LGA, the contacts contain lands. The contacts are arrayed in a matrix, the individual contacts being spaced approximately 1 millimeter apart, starting at approximately 1.5 millimeters inside bottom surface from the edge of the substrate.

In some applications of socketing a BGA and LGA component, an interposer with pins is used to provide an interface between the component and the motherboard. The interposer with pins may be useful if the user desires to plug the component into a conventional pin socket connection in a motherboard, as supported by electronics industry standards. The BGA or LGA may also be direct-socketed, that is, without using an interposer. If the component is direct-socketed, it is often necessary to use a stiffener on the underside of the motherboard opposite the side of the BGA or LGA component. Moreover, the motherboard usually must include gold plating on the motherboard contacts to enable acceptable electrical coupling between the BGA or LGA component and motherboard pursuant to industry requirements.

A present configuration for socketing a BGA or LGA component onto a motherboard without using an interposer is shown in side view, in FIG. 1. A motherboard 10 is provided. Motherboard 10 contains gold plating (not shown) to serve as the electrical contact points for a BGA or LGA component 20. A spacer 15 is provided directly above motherboard 10. Component 20 is provided above motherboard 10 and is surrounded by spacer 15. A compressible spring interconnect 25 made of elastomer or spring contact is disposed between component 20 and motherboard 10 and helps to improve electrical contact between component 20 and motherboard 10. A lid 35 is placed directly above component 20 to protect component 20 and to provide an interface to a heat sink if needed. A board stiffener 30 is disposed on the side of motherboard 10 opposite the surface that is coupled to component 20. Board stiffener 30 is necessary to spread a normal force of about 50 grams per contact, on each contact, from component 20. Without board stiffener 30, motherboard 10 will deflect from the force exerted from compressible spring interconnect 25. Board 30 stiffener contains tapped holes 40. Motherboard 10 contains screw holes 45 in alignment with stiffener tapped holes 40. Spacer 15 also contains screw holes 50 in alignment with board tapped holes 40. Lid 35 contains screw holes 55 in alignment with spacer screw holes 50. Lid 35, spacer 15, motherboard 10, and stiffener 30 are all clamped together with screws 60.

A problem with the present method of direct socketing is in the use of a stiffener on the backside of the motherboard. Having a stiffener adds significant cost to manufacturing due to the necessary additional materials. The stiffener also consumes real estate on the backside of the motherboard which could otherwise be used for placement of active components. Attaching the stiffener using screws requires additional manual labor, which adds further cost. In addition, to make a direct socketing solution viable, gold plating must be done on the motherboard contacts due to inadequacies with solder ball material and solder contacts in providing the necessary degree of electrical coupling. Adding gold plating to a motherboard adds cost to the board which is undesirable.

An alternative scheme for connecting a component to a motherboard is to use an interposer. This may be desirable for providing a socket for an electrical component that is consistent with normally used pin grid array connectors in the electronics industry. An example configuration of a BGA component utilizing an interposer for attachment to the motherboard is shown in FIGS. 2A–2B. A motherboard 80 holds a socketing stage 85. Socketing stage 85 is coupled to motherboard 80 using solder balls 90 on its underside, in a ball grid array. Solder balls 90 provide electrical contact between socketing stage 85 and motherboard 80. Holes 95 extending through the top surface of socketing stage 85 allow socketing stage 85 to serve as a recipient for a pin grid array interposer 100. Interposer 100, functioning as a normal pin-grid array socket, contains a series of pins 105 which are matched in location with corresponding holes 95 of socketing stage 85 so that when interposer 100 is inserted into socketing stage 85, pins 105 come into electrical contact with stage 85 and are thereby coupled to motherboard 80. The top surface of interposer 100 contains lands (not shown) so that interposer 100 can be electrically coupled to a BGA component 110 sitting above. BGA component 110 is shown to be disposed above interposer 100. Solder balls 120 on BGA component 110 are matched with corresponding lands (not shown) on interposer 100 so that BGA component 110 comes into electrical contact with interposer 100. The combination of interposer 100 with accompanying BGA component 110 forms the piggyback component 130 that can be inserted into socketing stage 85 as shown in FIG. 2B. By inserting piggyback component 130 in and out of socketing stage 85, the solder balls 90 on socketing stage 85 can remain intact and not be broken in the event component 110 needs to be exchanged with another component. Having socketing stage 85 remain stationary on motherboard 80, and the ability to socket items into and out of socketing stage 85 is desirable particularly for testing the reliability of motherboard 80 or components that may be coupled to motherboard 80.

While the interposer approach described here may be useful for testing, it is not desirable for production components due to the cost of the needed additional materials. Note that the interposer approach utilizes two substrates between the component and the motherboard. The substrates add cost to manufacturing by requiring extra materials.

It would be advantageous to provide a method of socketing a BGA or LGA component into the motherboard without having to use a stiffener, gold plating on the motherboard, or an interposer.

SUMMARY OF THE INVENTION

A socketing apparatus is disclosed. There is a member having a first side and a second side. There is a hole in the member extending from the first side to the second side. A pin is within the hole. The pin is attachable to a solder ball.

BRIEF DESCRIPTION OF THE DRAWINGS

The figures represent exemplary embodiments of the present invention, and should be viewed to assist in comprehending the invention. The drawings do not limit the invention to the embodiments shown.

DESCRIPTION OF PREFERRED EMBODIMENTS

The present invention discloses a design for mounting a BGA or LGA component onto a board without requiring a stiffener, gold plating, or a separate interposer and socketing stage. Embodiments will be described to facilitate the understanding of various ways of practicing the invention; however, the embodiments do not by any means limit the invention to the embodiments described. Any reference to dimensions, or "approximate" or like term, should be construed as the identified dimensions plus or minus reasonable manufacturing tolerances.

Figure 3A:
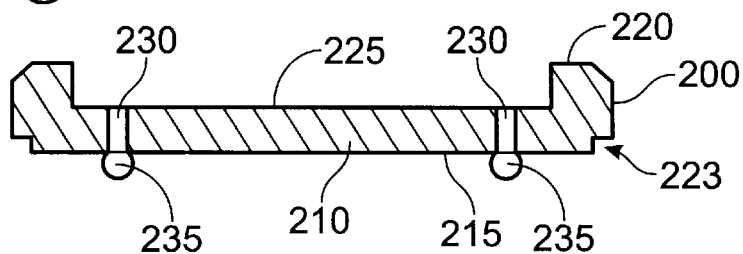
FIG. 3A is a side view of an embodiment of the present invention as applied to an interposer for mounting an electronic component to a motherboard.
Figure 3B:
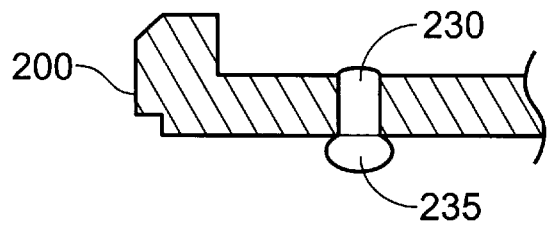
FIG. 3B is an expanded view of the embodiment shown in FIG. 3A.

Turning to FIGS. 3A–3B, a side view of an embodiment of a socketing mechanism of the present invention is shown. The socket described is for a 324-pin grid array that forms a substrate mountable on a motherboard. The outline dimension of the substrate that is mounted to a motherboard is approximately 1-inch square. There is a socketing substrate 200 that is attachable to a motherboard. Socketing substrate 200 is preferably made of plastic material, and may include polyphenylene sulphide. Socketing substrate 200 includes a horizontal base 210 on which an electronic component may be mounted. Base 210 may be approximately 0.093 inches in thickness from the bottom surface 215 of base 210 to the top surface 225 of base 210. A rise 220 forms an outer lip of an enclosure. Rise 220 may be approximately 0.200 inches in height from bottom surface 215 to the top horizontal surface of rise 220. Rise 220 functions as a wall to support a lid (embodiment described below) that may be mounted onto socketing substrate 200. Socketing substrate 200 also contains a cutout 223 shown at the bottom and outside corner of rise 220 to catch a support lid. Cutout 223 may be approximately 0.020 inches measured from bottom surface 215 to the top horizontal portion of cutout 223.

A series of pins 230 are embedded into socketing substrate 200 so that they are driven through the entire thickness of substrate 200 with the ends of pins 230 exposed on the bottom 215 and top 225 surfaces of substrate 200. Preferably, pins 230 are flush with top surface 225. Pins 230 are preferably made of brass and may be plated with nickel and gold. Because pins 230 provide landings for contact with an electronic component disposed thereon, it is important that pins 230 be substantially coplanar with one another, for example, within 0.002 inches of coplanarity. Solder balls 235 made of tin-lead at a composition of 63-37, are attached to the bottom of the pins 230. Solder balls 235 are soldered to a motherboard in accordance with a footprint of lands on the motherboard that correspond with the pattern of solder balls 235 on substrate 200. It is important for solder balls 235 to have a degree of coplanarity, for example, 0.004 inches in the case of a 324-pin grid array. Other manufacturing tolerances for the various dimensions may be approximate 0.005 inches.

Figure 4:
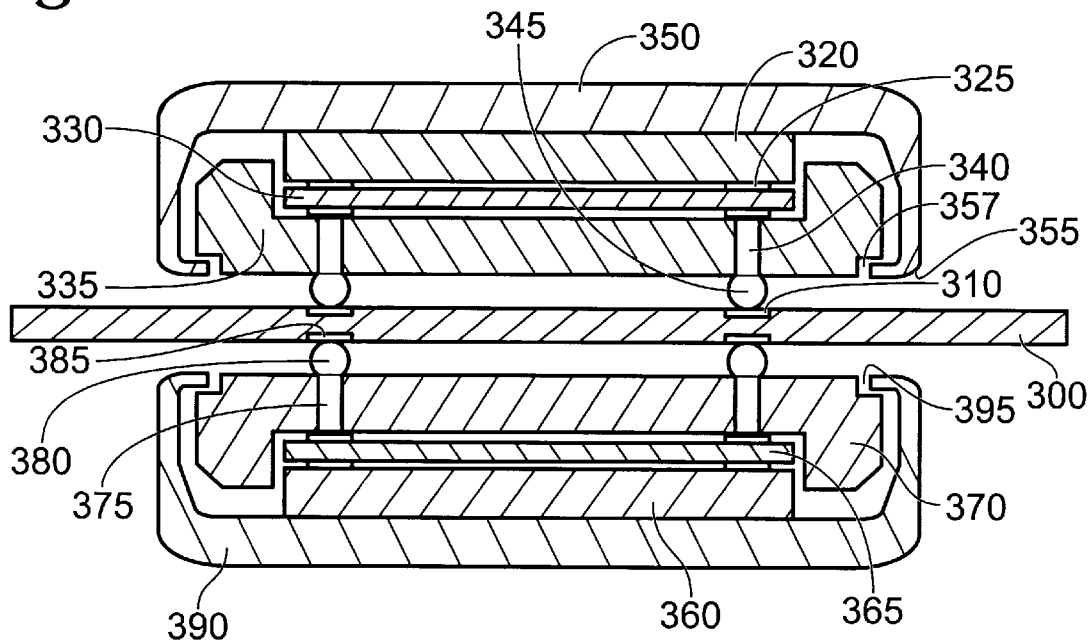
FIG. 4 is a side view of an embodiment of the present invention as applied to a dual sided motherboard mounted with electronic components.

An application of an embodiment of the invention described in FIG. 3 for a dual-sided motherboard is shown in FIG. 4. There is a motherboard 300 containing lands 310 for accepting an array of solder ball contacts. An electronic component 320 contains lands 325 in an array, on the underside of component 320. The topside of component 320 faces a lid 350. Lid 350 is preferably made of metal, and may be in thermal contact with electronic component 320 to provide protection as well as a mechanism for heat transfer from electronic component 320 to the ambient.

Lands 325 on electronic component 320 are electrically coupled to a series of embedded pins 340. Pins 340 are embedded within the entire thickness of a socketing substrate 335. Pins 340 are plated with nickel and gold to provide a gold interface for electronic component 320. Socketing substrate 335 is disposed horizontally with respect to motherboard 300. A compressible interconnect 330 made of elastomer or conductive metal spring contacts is disposed on the surface of socketing substrate 335, in between socketing substrate 335 and electronic component 320. Compressible interconnect 330 helps to enhance electrical coupling and alleviate stresses to the pins 340 that may arise through deflections to component 320 or substrate 335 materials due to thermal effects. A lid 350 covers all of electronic component 320 and wraps around the vertical sides of socketing substrate 335 so that a bottom lip 355 of lid 350 is inserted into a notch 357 in substrate 335 so that lid 350 maintains a snug fit onto substrate 335. Socketing substrate 335 is coupled to motherboard 300 through a series of solder balls 345 which are attached to the bottom of pins 340. Electrical contact is thus established between electronic component 320 and motherboard 300.

A second electronic component may be mounted on the opposite side of motherboard 300. For example, motherboard 300 may contain lands 385 on the opposite surface from lands 310. Lands 385 may have solder balls 380 contacted with them. Solder balls 380 are attached to the bottoms of embedded a series of pins 375. Pins 375 are embedded within the entire thickness of a socketing substrate 370. The tops of pins 375 are preferably flush with the surface of socketing substrate 370. Pins 375 are coupled to a compressible interconnect 365 which in turn is coupled to an electronic component 360. A lid 390 protects electronic component 360 from the ambient. Lid 390 is shown to wrap around the vertical side edge portion of socketing substrate 370 and is secured within a notch 395. All materials and dimensions disclosed in reference to FIG. 3 apply to the descriptions related to FIG. 4.

Figure 1:
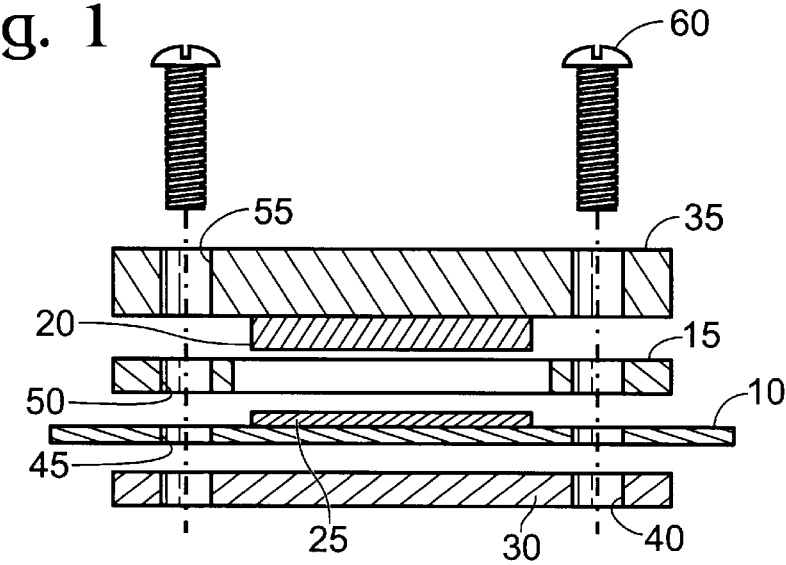
FIG. 1 is a side view of a packaged electronic component socketed into a motherboard utilizing a current technology.
Figure 2A:
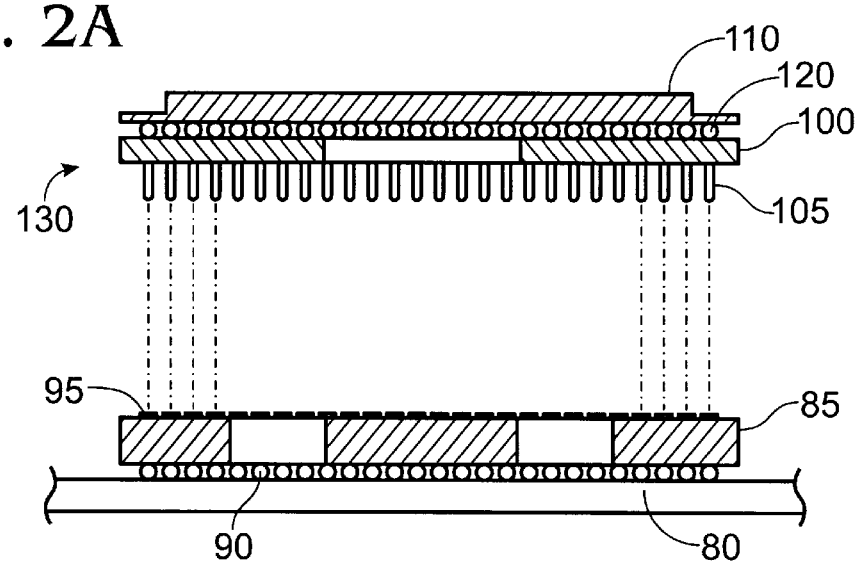
FIG. 2A is a side view of a packaged electronic component mounted onto a motherboard utilizing a pin grid array interposer.
Figure 2B:
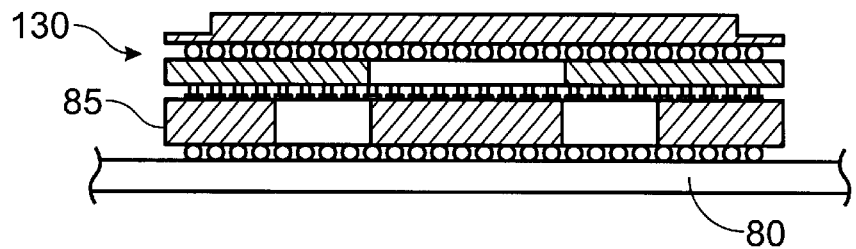
FIG. 2B is a side view of a packaged electronic component mounted onto a motherboard utilizing a pin grid array interposer, showing the interposer inserted into the socketing stage.

Note that when a socketing substrate is used for socketing a component to a motherboard, there is no need for a stiffener on the opposite side of the motherboard. Since gold plated pins can be used in the socketing substrate, it is not necessary to have gold plated landing pads on the motherboard. Moreover, since the socketing substrate can be used alone without an additional part as in FIG. 2, there are fewer materials that need to be used.

Thus, a socketing substrate utilizing a plurality of embedded pins attachable to solder balls has been disclosed. The invention is not limited to the embodiments described herein; a person of ordinary skill in the art may make variations from the descriptions and practice the invention, which is limited only by the claims below.

I claim:

1. An electronic assembly comprising:
a socketing substrate having a thickness bounded by a top surface and a bottom surface, the bottom surface being aligned horizontally with respect to a motherboard;
an array of solder balls disposed on the bottom surface of the socketing substrate to enable electrical coupling of the socketing substrate to corresponding pads on the motherboard;
an array of electrically conductive pins that are embedded through the thickness of the socketing substrate, the electrically conductive pins having a top end and a bottom end, the bottom end facing the motherboard; and
wherein the solder balls are disposed on the bottom end of the electrically conductive pins.

2. An electronic assembly as in claim 1, wherein said socketing substrate further includes a vertical portion that forms an enclosure.

3. An electronic assembly as in claim 2, further including an electronic component held within said enclosure, the electronic component having a top side and a bottom side.

4. An electronic assembly as in claim 3, wherein said electronic component is coupled to said socketing substrate using an array of lands disposed on the bottom side of the electronic component in electrical contact with the top end of the pins.

5. An electronic assembly as in claim 3, wherein said electronic component is coupled to said socketing substrate using an array of solder balls on the bottom side of the electronic component in electrical contact with the top end of the electrically conductive pins.

6. An electronic assembly as in claim 3, further including a lid which is held over the top side of the electronic component so as to protect the electronic component from the ambient.

7. An electronic assembly, comprising:
a motherboard having a first side and a second side, the first side and second side both having a plurality of electrical contact lands for accepting electrical contact with a substrate mounted thereon;
a first socketing substrate mounted on the first side of the motherboard, the first socketing substrate having an edge and a thickness, the first socketing substrate having a plurality of electrically conductive pins which are embedded through the thickness of the first socketing substrate, wherein the first socketing substrate is mounted onto the first side of the motherborad using a plurality of solder balls that correspond to the electrical contact lands on the first side of the motherboard;
a first electronic component mounted on the first socketing substrate, wherein the first electronic component is electrically coupled to the pins embedded in the first socketing substrate;
a second socketing substrate mounted on the second side of the motherboard, the second socketing substrate having an edge and a thickness, the second socketing substrate having a plurality of electrically conductive pins embedded through the thickness of the second socketing substrate, wherein the second socketing substrate is mounted onto the second side of the motherboard using a plurality of solder balls that correspond to the electrical contact lands on the second side of the motherboard; and
a second electronic component mounted on the second socketing substrate, wherein the second electronic component is electrically coupled to the pins embedded in the second socketing substrate.

8. An assembly as in claim 7, wherein the solder balls that correspond to the electrical contact lands on the first side of the motherboard are electrically contacted with the pins that are embedded in the first socketing substrate.

9. An assembly as in claim 7, wherein the solder balls that correspond to the electrical contact lands on the second side of the motherboard are electrically contacted with the pins that are embedded in the second socketing substrate.

10. An assembly as in claim 7, further including a first compressible interconnect between the first electronic component and the first socketing substrate.

11. An assembly as in claim 7, further including a second compressible interconnect between the second electronic component and the second socketing substrate.

12. An assembly as in claim 7, further including a first and second lid covering the first and second electronic component, respectively.

13. An assembly as in claim 12, wherein the first lid includes an edge that wraps around the edge of the first socketing substrate.

14. An assembly as in claim 12, wherein the second lid includes an edge that wraps around the edge of the second socketing substrate.

15. A socketing apparatus, comprising:
a member having a first side and a second side, wherein the member includes an enclosure in which an electronic component is held;
a hole within the member, the hole extending from the first side to the second side of the member;
a pin embedded in the hole, the pin extending through the entire length of the hole, the pin having an end, the end of the pin being attachable to a solder ball.

16. A socketing apparatus as in claim 15, wherein the pin is plated with electrically conductive material.

17. A socketing apparatus as in claim 16, wherein the electrically conductive material includes gold.

18. A socketing apparatus as in claim 15, further including a solder ball that is attached to the end of the pin.

19. An electronic assembly comprising:
a socketing substrate having thickness bounded by a top surface and a bottom surface, the bottom surface being aligned horizontally with respect to the motherboard, wherein the socketing substrate further includes a vertical side edge portion that forms an enclosure;
an array of solder balls disposed on the bottom surface of the socketing substrate;
an array of electrically conductive pins that are embedded through the thickness of the socketing substrate, the electrically conductive pins having a top end and a bottom end, the bottom end facing the motherboard, wherein the solder balls are disposed on the bottom end of the electrically conductive pins; and an electronic component held within said enclosure, the electronic component having a top side and a bottom side, wherein the electronic component is coupled to the socketing substrate using an array of lands disposed on the bottom side of the electronic component in electrical contact with the top end of the pins.

20. The electronic assembly of claim 19, further comprising:

a lid which is held over the top side of the electronic component.

* * * * *